United States Patent
Ogiro et al.

(10) Patent No.: US 8,085,534 B2
(45) Date of Patent: Dec. 27, 2011

(54) FLAT DISPLAY APPARATUS TO OPTIMALLY RADIATE HEAT

(75) Inventors: Kenji Ogiro, Yokohama (JP); Nobuyuki Kaku, Oiso (JP)

(73) Assignee: Hitachi, Ltd., Tokyo (JP)

( * ) Notice: Subject to any disclaimer, the term of this patent is extended or adjusted under 35 U.S.C. 154(b) by 434 days.

(21) Appl. No.: 12/428,732

(22) Filed: Apr. 23, 2009

(65) Prior Publication Data

US 2010/0008044 A1    Jan. 14, 2010

(30) Foreign Application Priority Data

Jul. 11, 2008    (JP) ................................. 2008-180879

(51) Int. Cl.
*H05K 7/20*    (2006.01)
*A47B 97/00*    (2006.01)

(52) U.S. Cl. .............. 361/688; 361/679.22; 361/679.46; 312/223.2; 248/918; 345/905

(58) Field of Classification Search ............ 361/679.46, 361/688, 679.21–679.25, 706; 312/223.1–223.2, 312/236; 248/917–923; 345/169, 905; 349/58, 349/65

See application file for complete search history.

(56) References Cited

U.S. PATENT DOCUMENTS

| 6,980,418 | B1 * | 12/2005 | Seeger et al. | 361/679.54 |
| 2008/0117599 | A1 * | 5/2008 | Endo et al. | 361/705 |
| 2009/0059489 | A1 * | 3/2009 | Yoo et al. | 361/679.21 |

FOREIGN PATENT DOCUMENTS

| JP | 2000-047599 | 2/2000 |
| JP | 2001-034179 | 2/2001 |
| JP | 2000-359569 | 6/2002 |
| JP | 2003-086979 | 3/2003 |
| JP | 2007-322752 | 12/2007 |

* cited by examiner

*Primary Examiner* — Zachary M Pape
(74) *Attorney, Agent, or Firm* — Kilpatrick, Townsend & Stockton LLP

(57) ABSTRACT

A flat display apparatus includes a display unit; a housing configured to accommodate the display unit; a support member configured to support the housing; and a cooling device configured to radiate heat of a heating element which is mounted in the housing, wherein the cooling device includes a first far infrared ray transfer member which is thermally connected to the heating element in the housing and a second far infrared ray transfer member which is thermally connected to an external portion of the housing at a rear surface side, wherein a radiating surface of the first far infrared ray transfer member and an absorbing surface of the second far infrared ray transfer member are disposed to oppose each other with the housing interposed therebetween, and wherein heat radiated from the first far infrared ray transfer member is radiated at both plane surface of the second far infrared ray transfer member.

4 Claims, 4 Drawing Sheets

FIG. 2A
INSTALLATION ON DESK
FIG. 2B
WALL CLOSELY INSTALLATION
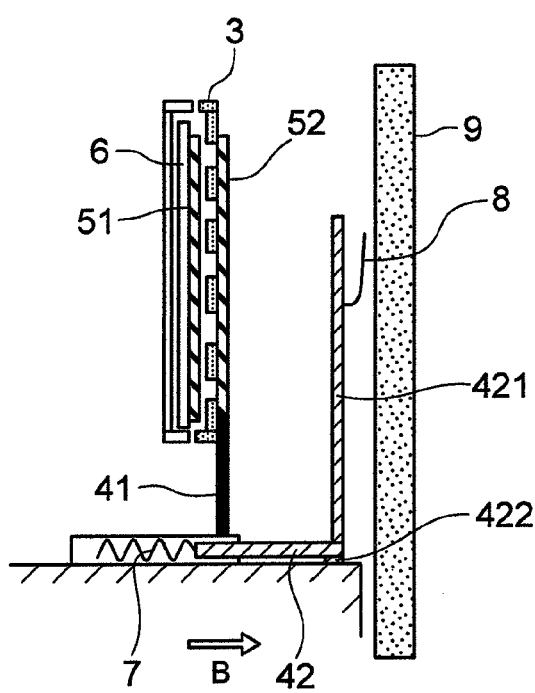
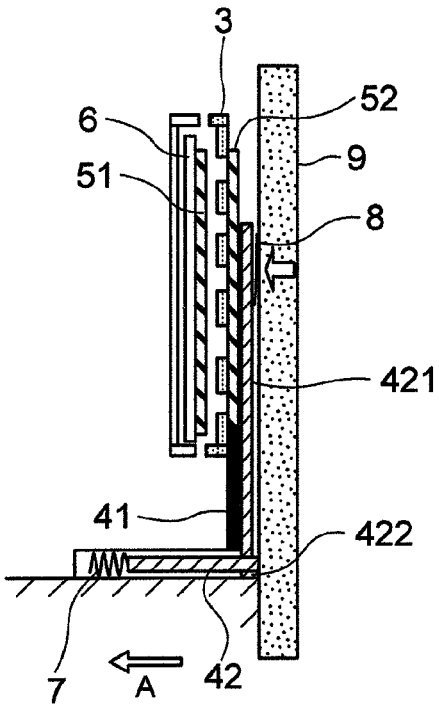
FIG. 2C
INSTALLATION ON DESK
FIG. 2D
WALL CLOSELY INSTALLATION
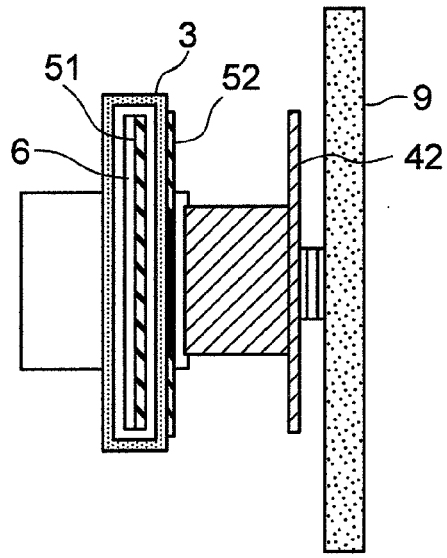
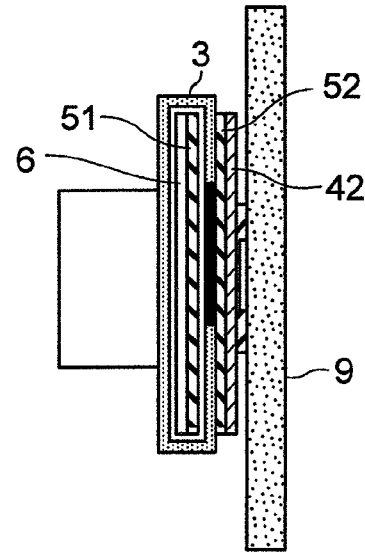

FIG. 4A
INSTALLATION ON DESK
FIG. 4B
WALL CLOSELY INSTALLATION
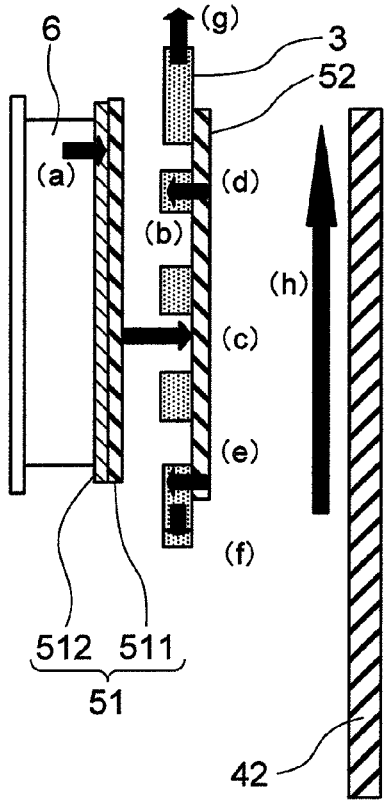
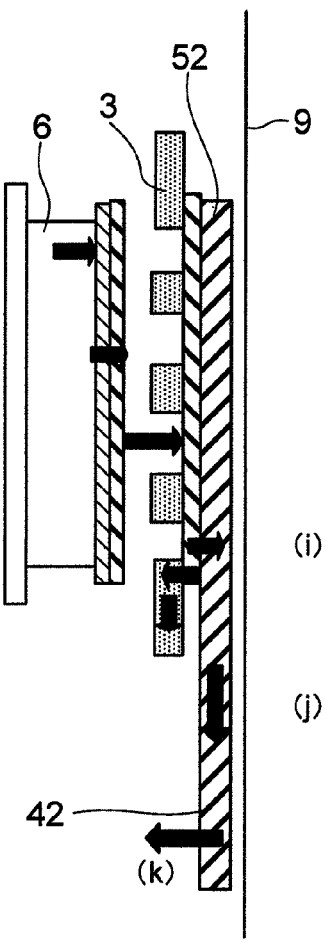

FLAT DISPLAY APPARATUS TO OPTIMALLY RADIATE HEAT

INCORPORATION BY REFERENCE

The present application claims priority from Japanese application JP 2008-180879 filed on Jul. 11, 2008, the content of which is hereby incorporated by reference into this application.

BACKGROUND OF THE INVENTION (1) Field of the Invention

The present invention relates to a flat display apparatus which is configured to obtain a stable installation state and to optimally radiate heat.

(2) Description of Related Art

In recent years, it is the trend that a demand for information display apparatus shifts to a flat display apparatus as the digital terrestrial broadcasting is shifted. For example, the flat display apparatus is used for a liquid crystal display panel, a plasma display panel, or the like. In the former case, a voltage is applied on a liquid element to change arrangement of liquid molecules, so that light is transmitted or blocked to display information. Further, a backlight device is included to radiate the transmission light. In the latter case, discharging elements are disposed in a cell shape, which are sealed by gluing two substrates together. In addition, a fluorescent material on the glass substrates emits light by discharging these discharging elements in the sealed space, so that the information is displayed.

These flat display apparatuses are display panels having different display scheme, but are in the same circumstance that heat generation is increased as the screen is larger and brightness is higher. Moreover, in addition to the heat generation of the display panel, high performance semiconductor devices for operating and controlling the display apparatus are also in the state of generating the heat. Therefore, to solve a rise in temperature in the display apparatus caused by the heat generation from each heating element which is mounted in high density, JP-A-2002-162910 discloses that a space in a housing is ventilated to be evacuated upwardly, so that the heat generated in the apparatus is radiated to the outside. However, as the flat display apparatus is made thinner, the space in the housing is narrowed, and thus it is difficult to ventilate the housing.

On the other hand, the flat display apparatus is generally installed on a desk surface of an installation table on which the display apparatus is provided (desk installation). However, in order to stably install the upsizing flat display apparatus, it is necessary to increase a contact area of a support table which comes into contact with the desk surface. Moreover, the flat display apparatus is yearly accelerated to be thinner every year. Therefore, in order to take advantage of characteristics of the flat display apparatus, the flat display apparatus is being installed (wall closely installation) along the plane wall by closing together to the utmost instead of being installed on the desk surface of the installation table which is placed on the corner of a room as the conventional installation.

However, in the wall closely installation, since the display panel on the support table protrudes rearward, and the protruding portion is an obstacle, a position for close contact with the wall is also limited. In addition, even when the support table is improved in order for close contact with the wall, a flow of air is worsened in a rear surface side of the housing of the flat display apparatus. Therefore, the thermal radiation for the heat generation in the apparatus is inhibited. As a result, it does not take advantage of the characteristics of the thin display panel. In response to the problem in the wall closely installation, JP-A-2000-47599, JP-A-2007-322752, and JP-A-2001-34179 disclose a technique relating to a structure in which the support table of the thin display apparatus can be deformed in a case where the supporter is installed at the middle portion of the desk and in a case where the supporter is installed in a state of close contact with the wall, for example.

In addition, in the wall closely installation, the space at the rear surface side of the housing for radiating the heat generated in the flat display apparatus is difficult to be secured. Therefore, JP-A-2003-86979 discloses a cooling structure using the wall, for example.

BRIEF SUMMARY OF THE INVENTION

The conventional techniques described above have a technical problem to be necessarily solved by providing an optimal installation state in the wall closely installation of the flat display apparatus according to the present invention.

In a display apparatus described in JP-A-2002-162910, openings are provided on the top portion and the bottom portion of a housing so as to be communicated with the outside, and an air-flow space is formed so as to connect the openings. Therefore, even when the display device is installed in close to the wall, efficiency in thermal radiation in the display apparatus is increased. However, in the technique described in JP-A-2002-162910, since the air-flow space is provided for dedicated use, it inhibits the display apparatus from being thinner. In addition, since the heat is radiated by being transferred to the air and by a convection manner, there is a need for countermeasures about a forced draft or the like in order to improve an effect of thermal radiation.

In a thin display apparatus described in JP-A-2000-47599, an auxiliary base plate is provided, which can slide to protrude in parallel with the base bottom surface in the base of a stand. By pulling out the auxiliary base plate, it is achieved that the thin display apparatus is stabilized. However, the technique described in JP-A-2000-47599 relates to fixing the auxiliary base plate on the desk in order to prevent the thin display apparatus from falling. Further, when a cable is plugged or to be unplugged with respect to a connector provided on the rear surface of the thin display apparatus, or when it is necessary to access the apparatus for maintenance, the desk should be also moved together. In addition, changing the installation position between the wall closely installation and the desk installation at any time, or the like has not been taken into consideration. In addition, there is no description about thermal radiation.

In a display apparatus described in JP-A-2007-322752, a shape-changeable structure is provided to come into contact with a desk surface which is rotatably supported on a support table which supports the display unit via a stand. A rotation unit can be installed to be mounted on the wall by straightly standing up to at least front side of the support table. In addition, a mechanism for biasing a movable unit of the support table in a direction to come into contact with the desk surface is provided. Therefore, it is configured to easily change the position of the wall-mounted installation and the desk installation. However, in the technique described in JP-A-2007-322752, there is no consideration for the thermal radiation in a state of the wall-mounted installation.

In a display apparatus described in JP-A-2001-34179, a stand is provided, and a bottom surface unit of which is configured to come into contact with a table and to include a first bottom surface unit which does not move and a second bottom surface unit which moves in a rear surface direction of the display apparatus. The display apparatus is applicable to any one of the installation near the wall and the installation on a table surface separated from the wall. However, also in the technique described in JP-A-2001-34179, there is no description about the thermal radiation in the wall close installation as in JP-A-2000-47599.

In an electronic apparatus described in JP-A-2003-86979, a far infrared radiation member is formed on the entire or a part of a casing surface made of an Al alloy, and a black positive electrode oxide film is formed on the far infrared radiation member. Further, the inside of the casing is cooled by radiating the far infrared rays. Further, in the technique described in JP-A-2003-86979, the far infrared rays radiated from the far infrared radiation member are absorbed in the wall to be converted into heat, and to be diffused in a wide range of the wall. However, since the wall material generally tends to be made of a material having a low heat transfer rate and tends to be made of a material excellent in absorbing the far infrared rays, there is some fear that the opposite surface to the far infrared radiation member of the electronic apparatus is rapidly heated. Therefore, the cooling effect depends on the wall material. In addition, there is a problem in that the wall will be tanned. Further, when the wall is not disposed behind the electronic apparatus, there is some fear that the cooling performance significantly changes.

In order to solve the problem described above, a flat display apparatus of the present invention includes: a display unit; a housing configured to accommodate the display unit; a support member configured to support the housing; and a cooling device configured to radiate heat of a heating element which is mounted in the housing, wherein the cooling device includes a first far infrared ray transfer member which is thermally connected to the heating element in the housing and a second far infrared ray transfer member which is thermally connected to the outside of the housing at a rear surface side of the display unit, wherein a radiating surface of the first far infrared ray transfer member and an absorbing surface of the second far infrared ray transfer member are disposed to oppose to each other with the housing interposed therebetween, and wherein heat radiated from the first far infrared ray transfer member is radiated at both plane surface of the second far infrared ray transfer member.

In addition, according to the flat display apparatus of the present invention, the support member includes a first support member which is integrally fixed to the housing and a second support member which slidably reciprocates with respect to the first support member. Further, the second support member is thermally connected to or disconnected from the second far infrared ray transfer member according to the reciprocating movement with respect to the first support member. In addition, when the flat display apparatus is installed so as to become close to a wall, the second support member moves to the first support member to be thermally connected with the second far infrared ray transfer member.

In addition, according to the flat display apparatus of the present invention, the second support member includes a bias member which holds the second support member so as to apply an elastic biasing force in a direction away from the first support member and an elastic pressing member which presses the second far infrared ray transfer member by a pressing force from the outside.

According to such a configuration of the present invention, it is possible to provide the flat display apparatus, which achieves a stable installation of the flat display apparatus when it is installed on the desk. In addition, it is possible to obtain an optimal installation state regardless of an installation place without inhibiting efficiency in thermal radiation of the flat display apparatus when it is installed in close contact with the wall.

Other objects, features and advantages of the invention will become apparent from the following description of the embodiments of the invention taken in conjunction with the accompanying drawings.

BRIEF DESCRIPTION OF THE SEVERAL VIEWS OF THE DRAWING

FIGS. 2A to 2D are views illustrating a displacement appearance of a flat display apparatus according to an embodiment of the present invention.

FIGS. 4A and 4B are views illustrating a heat transfer state in a configuration of the display apparatus according to an embodiment of the present invention.

DETAILED DESCRIPTION OF THE INVENTION

Hereinafter, an embodiment of the present invention will be described with reference to the accompanying drawings.

Figure 1:
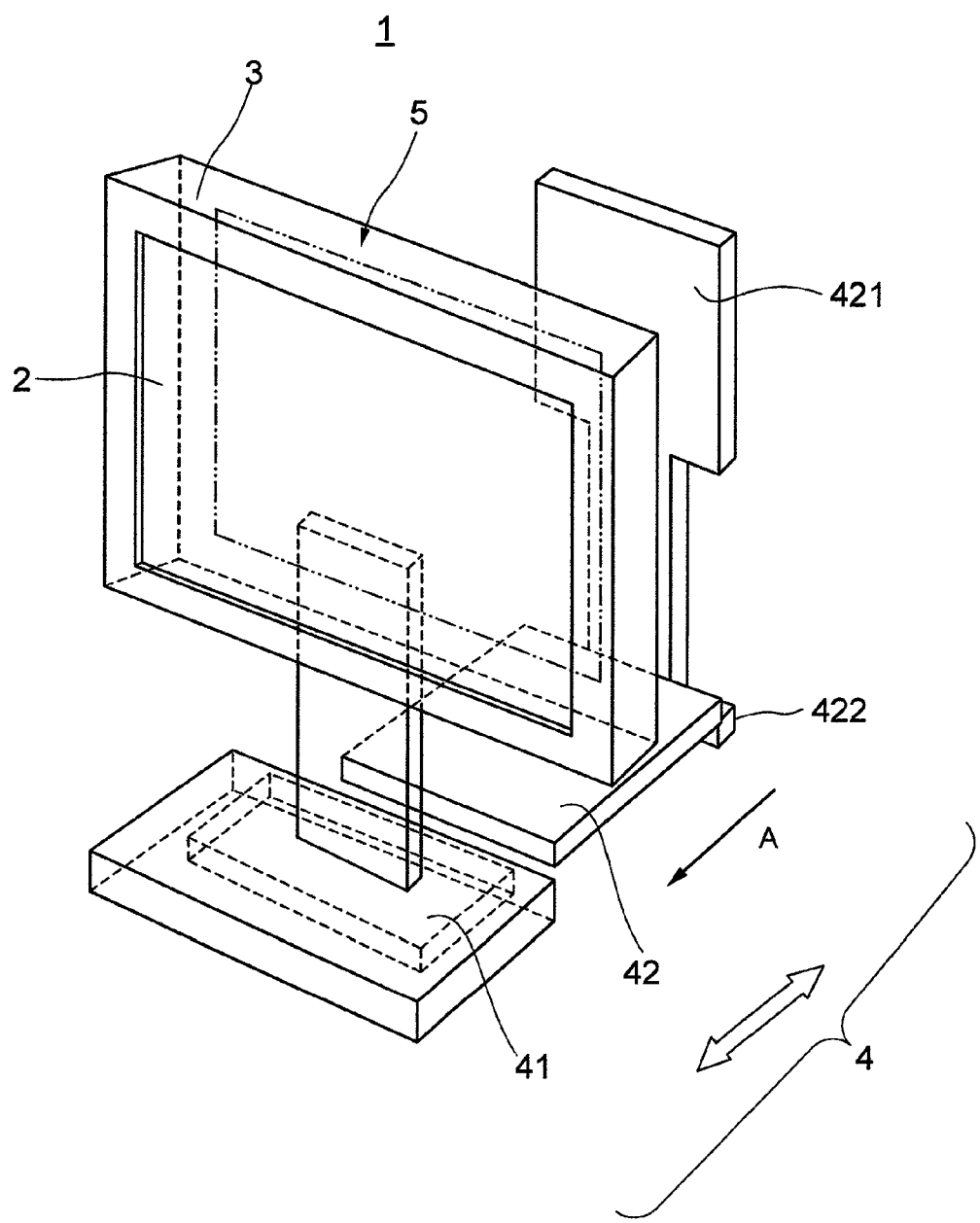
FIG. 1 is a perspective view illustrating a configuration of a flat display apparatus according to an embodiment of the present invention.

FIG. 1 is a conceptual perspective view schematically illustrating a configuration of the flat display apparatus according to an embodiment of the present invention. FIG. 1 illustrates a support member 4 partly exploded. As shown in FIG. 1, the flat display apparatus 1 includes a display panel (display unit) 2, a housing 3 configured to accommodate the display unit 2, a circuit substrate (not shown) and the like, and the support member 4 configured to support the housing 3. Further, the support member 4 includes a first support member 41 and a second support member 42. The first support member 41 is integrally fixed on the housing 3. The second support member 42 is engaged with the first support member 41 in the direction of arrow A to be attached thereto. The details of a structure of the support member 4 will be described later. The second support member 42 is configured to be slidably reciprocated in the direction of a black arrow with respect to the first support member 41. In addition, a cooling device 5 is mounted in the housing 3.

Next, the flat display apparatus 1 in which the cooling device 5 is mounted and the cooling device 5 will be described with reference to FIGS. 2 to 4.

FIGS. 2A to 2D are cross-sectional views illustrating a state of each installation of the flat display apparatus according to the embodiment.

FIGS. 2A and 2C show a state in which the flat display apparatus is installed on the desk at a position away from the wall 9. FIGS. 2B and 2D show a state in which the flat display apparatus is installed in close contact with the wall 9. As shown in FIGS. 2A to 2D, the cooling device 5 includes a first far infrared ray transfer member 51 which is thermally connected to a heating element 6 in the housing 3 and a second far infrared ray transfer member 52 which is thermally connected to an external plane surface at the rear side of the housing 3. That is, the first far infrared ray transfer member 51 and the second far infrared ray transfer member 52 are disposed to oppose to each other with the housing 3 interposed therebetween.

Here, a part of the heating element 6 of the flat display apparatus 1 may be a display unit 2 of a plasma display panel itself in a case of a plasma display apparatus, or may be the display unit 2 including a backlight device in a case of a liquid crystal display apparatus. In addition, the heating element 6 of a cooling object may be a circuit substrate on which an element for controlling each display panel, for example, a CPU, and semiconductor devices such as an image processing IC are mounted, or may be the display unit 2 including the circuit substrate. As described above, the display unit 2 or the heating element 6 formed as the circuit substrate is thermally connected to the first far infrared ray transfer member 51. At an opposite side of the heating element 6 with the first far infrared ray transfer member 51 interposed therebetween, the housing 3 is disposed, which sets a narrowed space to the utmost such that the flat display apparatus 1 is made thinner. The second far infrared ray transfer member 52 is provided on an external plane surface the rear surface side of the housing 3 to oppose to the first far infrared ray transfer member 51. Further, the second far infrared ray transfer member 52 is thermally connected to the housing 3.

On the other hand, the support member 4 configured to support the housing 3 of the flat display apparatus 1 includes a first support member 41 which is integrally formed with the housing 3 and a second support member 42 which freely reciprocates with respect to the first support member 41 in a state where the flat display apparatus 1 is installed.

Here, the second support member 42 is biased in the direction of arrow B and held by a bias member 7 having an elastic biasing force. That is, the second support member 42 of the flat display apparatus 1 is installed on the desk so as to be away from the wall 9, and held to set a sufficient length (L), so that the flat display apparatus 1 is stably supported. Therefore, a space is formed between the second far infrared ray transfer member 52 and the second support member 42, which has a predetermined distance through which the apparatus is sufficiently ventilated.

In addition, the second support member 42 of the flat display apparatus 1 in a state of the wall 9 contact installation is pressed in the direction of arrow A against the biasing force of the bias member 7 by the wall surface. Then, the second support member 42 enters into the first support member 41, and is maintained in a state of closing to the wall surface. At this time, an elastic pressing member 8 is provided on the rear surface of the second support member 42 so as to be elastically deformed while coming into contact with the wall 9. A plane surface 421 of the second support member 42 is thermally connected with the second far infrared ray transfer member 52 by an elastic biasing force of the elastic pressing member 8.

According to such a configuration described above, for example, even when the flat display apparatus 1 is installed on the desk surface away from the wall 9 in order to plug or unplug a cable with respect to a connector on the rear surface of the flat display apparatus 1 which is installed in the state of close contact with the wall 9 shown in FIGS. 2B and 2D, the second support member 42 is automatically extended by the biasing force of the bias member 7, so that it is possible to keep the flat display apparatus 1 in a stably supported state. For the purpose of easy performing this operation, it is preferable that a low friction member, such as a roller (the details are not shown), be attached on a contact surface 422 on which the second support member 42 comes into contact with the desk surface.

Next, the cooling device 5 will be described.

Figure 3:
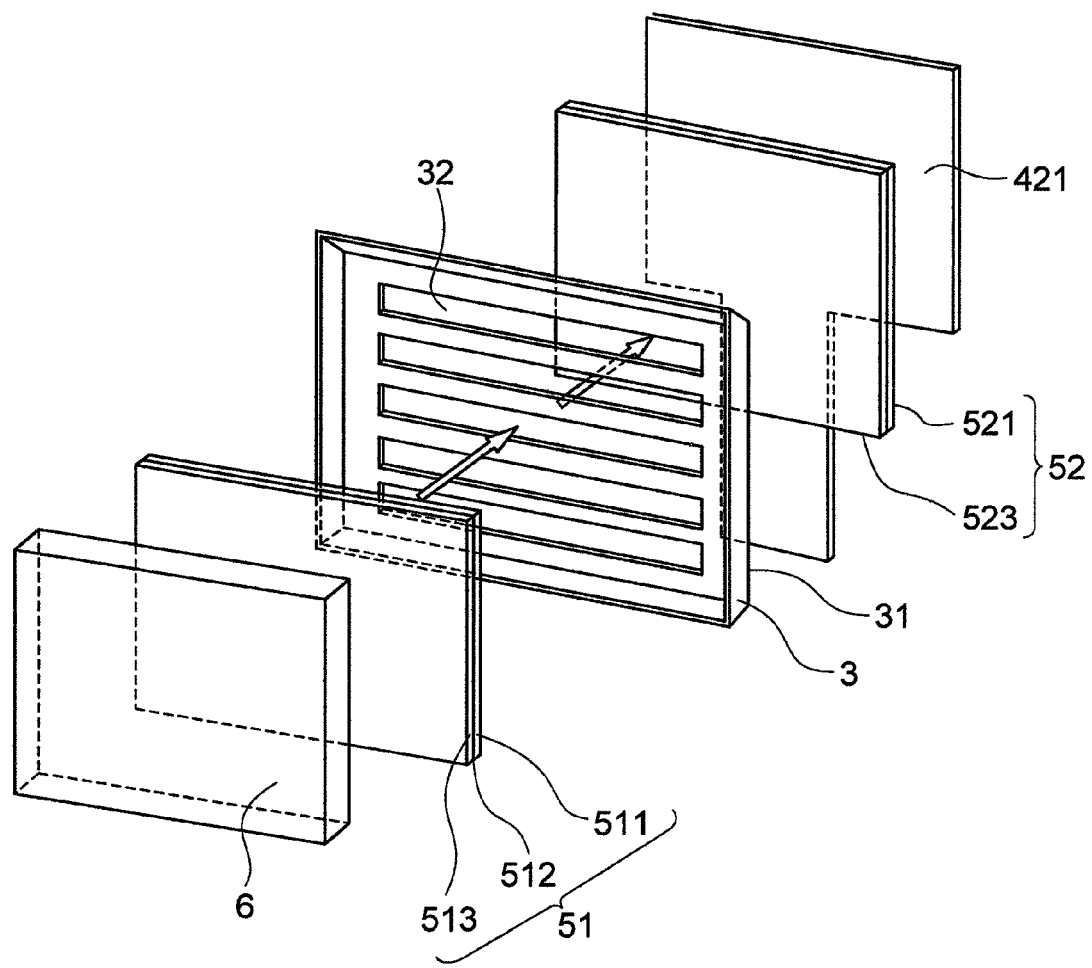
FIG. 3 is an exploded perspective view illustrating a configuration of a cooling device having far infrared ray transfer members according to an embodiment of the present invention.

FIG. 3 is an exploded perspective view conceptually illustrating a configuration of the cooling device by the far infrared ray transfer member according to the present embodiment. FIG. 4 is a conceptual view illustrating a heat transfer state in the configuration of the display apparatus of the present embodiment.

As shown in FIG. 3, the first far infrared ray transfer member 51 and the second far infrared ray transfer member 52 include thermal radiation layers 511 and 521 configured to include, for example, a ceramic material as a main body, which radiates a far infrared ray when it heated, respectively.

The first far infrared ray transfer member 51 which is thermally connected with the heating element 6 in the housing 3 includes the thermal radiation layer 511 and a thermal conduction layer 512 which is made of aluminum, a carbon graphite sheet, or the like excellent in thermal conductivity. In addition, the first far infrared ray transfer member 51 includes an adhesion layer 513 formed as a laminated structure which is advantageous in avoiding a point contact between the heating element 6 and the thermal conduction layer 512 (that is, contact between the both surfaces). That is, the heating element 6 is thermally connected with the thermal conduction layer 512 via the adhesive layer 513.

A little (for example, about 1 mm) space is formed between the thermal radiation layer 511 of the first far infrared ray transfer member 51 and the rear surface 31 of the housing 3. Further, the second far infrared ray transfer member 52 is attached on the external plane surface of the rear surface 31 of the housing 3. The second far infrared ray transfer member 52 has an adhesive layer 523 which is advantageous in avoiding a point contact with the housing 3 (that is, contact between the both surfaces). That is, the rear surface 31 of the housing 3 is thermally connected with the thermal radiation layer 521 via the adhesive layer 523.

Here, the housing 3 is preferably configured to include a metal material such as an aluminum material which is excellent in thermal conductivity in order to radiate the heat of the heating element 3. In addition, the housing 3 is configured to include a plurality of openings 32 which pass electromagnetic waves radiated from the first far infrared ray transfer member 51 toward the second far infrared ray transfer member 52.

Next, the thermal radiation layers 511 and 521 of the first far infrared ray transfer member 51 and the second far infrared ray transfer member 52 will be described. Materials which are easy to radiate the far infrared rays (electromagnetic waves) are easy to absorb the electromagnetic waves. Resins or minerals have high emissivity. Metals have low emissivity. The first far infrared ray transfer member 51 which is thermally connected to the heating element 6 receives the heat from the heating element 6 via the thermal conduction layer 512, and the heat is converted into the electromagnetic wave corresponding to the far infrared ray by the thermal radiation layer 511, so that the heat energy of the heating element is radiated.

The radiation energy per unit area is expressed in Equation 1 below.

$$E = \sigma \times T^4 \quad (\sigma = 5.6697 \times 10^{-8}) \quad \text{(Equation 1)}$$

E (radiation energy): [W/m$^2$]
σ (Stefan: Boltzmann constant): [Wm$^{-2}$K$^{-4}$]
T (absolute temperature): [K]

In the thermal radiation, the heat is transferred to the air by the general ventilation or the like. An amount of the transferred heat is proportional to the difference between the temperature of the heating element 6 and the temperature of the air. On contrary, as shown in Equation 1, the radiation energy by the radiation of the far infrared ray is radiated in proportion to the 4th power of the difference between the temperature of the first far infrared ray transfer member 51 at the side of the heating element 6 and the temperature of the second far infrared ray transfer member 52 at the side of the thermal radiation. Therefore, even if there is a slight difference in temperature between the radiating side and the absorbing side, a large amount of heat can be transferred from the first far infrared ray transfer member 51 to the second far infrared ray transfer member 52. As a result, decrease in temperature of the heating element 6 can be achieved, and cooling performance of the cooling device 5 can be improved.

The far infrared ray radiated from the first far infrared ray transfer member 51 by the heat from the heating element 6 is received to the second far infrared ray transfer member 52. The radiation energy of the far infrared ray is almost absorbed in depth of several 100 μm, and converted into the heat energy. That is, the far infrared ray absorbed in the second far infrared ray transfer member 52 is almost never transmitted to the surface opposite to the heat-receiving surface, also never irradiated to the wall surface which is disposed on the rear surface of the second far infrared ray transfer member 52. Therefore, there is no need to worry about that the wall 9 is burned by the heat received to the second far infrared ray transfer member 52.

In addition, among the far infrared rays radiated from the first far infrared ray transfer member 51, the far infrared rays irradiated to the housing 3 is reflected in a case where the housing 3 is made of a metal material which is hard for the housing 3 to absorb the far infrared ray.

There is no problem even though the reflected heat is absorbed by the first far infrared ray transfer member 51. However, it is preferable that the housing 3 also absorbs the electromagnetic waves in order to improve the efficiency in the heat transfer. For this reason, it is more preferable that a black coating material or the like which is easy to absorb the electromagnetic waves is coated on the plane surface opposite to the first far infrared ray transfer member 51 at the inside of the housing 3.

The materials which are easy to irradiate the far infrared rays are also easy to absorb the far infrared rays. Therefore, the first far infrared ray transfer member 51 and the second far infrared ray transfer member 52 may be configured to include the same ceramic material as a main body.

Even though a part of the description is repeated, a state of the heat transfer will be described with reference to FIGS. 4A and 4B. The heat of the heating element 6 is (a) transferred to the thermal conduction layer 512 of the first far infrared ray transfer member 51, (b) diffused by the thermal conduction in the thermal conduction layer 512 and then transferred to the thermal radiation layer 511 by the heat transfer, (c) converted into the electromagnetic energy by the thermal radiation layer 511 and is radiated, and (d) absorbed in the second far infrared ray transfer member 52 to be converted into the heat energy in the second far infrared ray transfer member 52.

Here, the second far infrared ray transfer member 52 rises in temperature due to the converted heat energy. Then, the second far infrared ray transfer member 52 is thermally connected with the housing 3 which is formed of a material excellent in the heat conductivity. Therefore, the heat converted in the second far infrared ray transfer member 52 is (e) transferred to the housing 3 by the thermal connection with the plane surface 31 of the housing 3, and (f) diffused by the heat conductivity of the housing 3 to other portions of the housing 3 or to the first support member 41 which is integrally connected with the housing 3. Then, the heat is (g) transferred and radiated to the external air from each surface of the housing 3, the first support member 41, or the like diffused by the heat. That is, the heat of the heating element is transferred with more efficiency than in the housing 3 and conducted to a low temperature region in a wide outside of the housing 3. Therefore, the heat can be radiated in the air. According to the present embodiment, the heat is transferred to the air which flows in the space in the housing 3, so that the cooling performance can be improved rather than the conventional method of transferring the heat by natural convection, forced draft, or the like. In addition, since there is no need to secure the space for flowing out the air, thin flat display apparatus 1 can be obtained.

The electromagnetic wave which is absorbed in the second far infrared ray transfer member 52 is converted to heat energy in the surface portion (several 100 μm) of the absorbing plane surface of the second far infrared ray transfer member 52, and then transferred to the housing 3 which is thermally connected at the side of the absorbing plane surface to be cooled. However, in accordance with an amount of the heat of the heating element 6, there also assumed a case where a part of the amount of rise in temperature remains in the second far infrared ray transfer member 52, and a deep portion of the far infrared ray transfer member rises in temperature. When the flat display apparatus 1 is installed on the desk in such a heating state, a space is provided between the second support member 42 and the plane surface opposite to the side of the housing 3 of the second far infrared ray transfer member 52. By contacting with the external air, (h) the heat is transferred to the external air to be radiated. On the other hand, in a case of the wall closely installation state, the second far infrared ray transfer member 52 is thermally connected with the second support member 42. Therefore, the heat of the second far infrared ray transfer member 52 is (i) transferred to the second support member 42, and (j) diffused to the second support member 42. Then, since the second support member comes into contact with the external air, the heat is (k) transferred to the external air to be radiated. That is, the second support member 42 serves as a heatsink for radiating the heat. Therefore, the second support member 42 is preferable to be made of aluminum excellent in the heat conductivity for radiating the heat.

That is, since the cooling operation is performed by thermally connecting the housing 3 and the second support member 42 with the external heat radiation member in both plane surfaces of the second far infrared ray transfer member 52, the entire housing is used as a heat radiation member. Therefore, it can be realized that the heat is radiated with more efficiency with respect to the heating element 6 in which packaging density is increased in the thin flat display apparatus 1. In addition, when the flat display apparatus is installed in close contact with the wall 9, since the second support member 42 is thermally connected to the second far infrared ray transfer member 52 even though it is difficult to make a space at the rear surface side of the second far infrared ray transfer member 52, it is possible to prevent the cooling operation from being decreased.

The radiation operation in the second far infrared ray transfer member 52 is carried out by the reciprocating movement of the support member. Therefore, it is possible to realize that the flat display apparatus is stably held and the heat generated therefrom is radiated even when the flat display apparatus is installed on the desk away from the wall 9 or to be close contact with the wall 9.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A flat display apparatus comprising:
a display unit;
a housing configured to accommodate the display unit;
a support member configured to support the housing; and
a cooling device configured to radiate heat of a heating element which is mounted in the housing;
the cooling device includes a first far infrared ray transfer member which is thermally connected to the heating element in the housing and a second far infrared ray transfer member which is thermally connected to the outside at a rear surface side of the housing and has two plane surfaces,
a radiating surface of the first far infrared ray transfer member and an absorbing surface of the second far infrared ray transfer member are disposed to oppose to each other with the housing interposed therebetween, and
heat radiated from the first far infrared ray transfer member is in turn radiated at both of the plane surfaces of the second far infrared ray transfer member.

2. The flat display apparatus according to claim 1, wherein
the support member includes a first support member which is integrally fixed to the housing and a second support member which slidably reciprocates with respect to the first support member,
the second support member is thermally connected to or disconnected from the second far infrared ray transfer member according to the reciprocating movement with respect to the first support member, and
the second support member moves to the first support member to be thermally connected with the second far infrared ray transfer member in the case of the flat display apparatus being installed in close to a wall.

3. The flat display apparatus according to claim 2,
wherein the second support member includes a bias member which holds the second support member so as to apply an elastic biasing force in a direction away from the first support member and an elastic pressing member which presses the second far infrared ray transfer member by a pressing force from the outside.

4. The flat display apparatus according to claim 2,
wherein the second support member includes a bias member which holds the second support member so as to apply an elastic biasing force in a direction away from the first support member and an elastic pressing member which presses the second far infrared ray transfer member by a pressing force from the outside.

* * * * *